(12) United States Patent
Ishiguro et al.

(10) Patent No.: US 12,212,311 B2
(45) Date of Patent: Jan. 28, 2025

(54) SWITCH CIRCUIT AND COMMUNICATION APPARATUS

(71) Applicant: SONY SEMICONDUCTOR SOLUTIONS CORPORATION, Kanagawa (JP)

(72) Inventors: Yuya Ishiguro, Kanagawa (JP); Hiroaki Nagano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 4 days.

(21) Appl. No.: 17/799,966

(22) PCT Filed: Jan. 29, 2021

(86) PCT No.: PCT/JP2021/003198
§ 371 (c)(1),
(2) Date: Aug. 16, 2022

(87) PCT Pub. No.: WO2021/171901
PCT Pub. Date: Sep. 2, 2021

(65) Prior Publication Data
US 2023/0103990 A1 Apr. 6, 2023

(30) Foreign Application Priority Data

Feb. 25, 2020 (JP) ................................ 2020-029853

(51) Int. Cl.
*H03K 17/16* (2006.01)
*H03K 17/687* (2006.01)

(52) U.S. Cl.
CPC ....... *H03K 17/162* (2013.01); *H03K 17/6871* (2013.01); *H03K 17/6877* (2013.01)

(58) Field of Classification Search
CPC ............. H03K 17/162; H03K 17/6871; H03K 17/6877; H03K 17/102
See application file for complete search history.

(56) References Cited

U.S. PATENT DOCUMENTS

2008/0224818 A1* 9/2008 Tanimura ............. H01C 17/006
 29/620
2014/0312957 A1 10/2014 Ranta et al.
2015/0303982 A1* 10/2015 Yang ........................ H04B 1/48
 455/82

(Continued)

FOREIGN PATENT DOCUMENTS

JP 2002-246552 A 8/2002
JP 2009-124653 A 6/2009

(Continued)

OTHER PUBLICATIONS

International Search Report and Written Opinion of PCT Application No. PCT/JP2021/003198, issued on Apr. 20, 2021, 09 pages of ISRWO.

*Primary Examiner* — Sibin Chen
(74) *Attorney, Agent, or Firm* — CHIP LAW GROUP

(57) ABSTRACT

A switch circuit includes: a plurality of semiconductor elements (10) connected in series to each other; capacitive elements connected to at least some semiconductor elements (10) among the plurality of semiconductor elements (10); and a resistance element (30) connected between the capacitive elements.

17 Claims, 15 Drawing Sheets

1A

(56) References Cited

U.S. PATENT DOCUMENTS

| | | | | |
|---|---|---|---|---|
| 2019/0393904 A1* | 12/2019 | Lin | .................. | H04B 1/1081 |
| 2020/0028504 A1* | 1/2020 | Solomko | .............. | H03K 17/102 |
| 2023/0246639 A1* | 8/2023 | Blum | .................. | H03K 17/102 |
| | | | | 327/427 |

FOREIGN PATENT DOCUMENTS

| | | |
|---|---|---|
| WO | 2010/098051 A1 | 9/2010 |
| WO | 2018/139495 A1 | 8/2018 |

* cited by examiner

SWITCH CIRCUIT AND COMMUNICATION APPARATUS

CROSS REFERENCE TO RELATED APPLICATIONS

This application is a U.S. National Phase of International Patent Application No. PCT/JP2021/003198 filed on Jan. 29, 2021, which claims priority benefit of Japanese Patent Application No. JP 2020-029853 filed in the Japan Patent Office on Feb. 25, 2020. Each of the above-referenced applications is hereby incorporated herein by reference in its entirety.

TECHNICAL FIELD

The present disclosure relates to a switch circuit and a communication apparatus.

BACKGROUND ART

A radio-frequency switch configured to switch a radio-frequency signal is provided in a front end of a communication apparatus such as a mobile terminal. As such a radio-frequency switch, for example, a switch circuit including a plurality of transistors (field effect transistors (FETs)) is known.

Patent Document 1 discloses a technology in which a metal plate is provided above a transistor to which a relatively high voltage is applied among a plurality of transistors to suppress a variation in voltage between a drain and a source of each of the transistors and improve a withstand voltage.

CITATION LIST

Patent Document

Patent Document 1: U.S. Patent Application Laid-Open No. 2014/0312957

SUMMARY OF THE INVENTION

Problems to be Solved by the Invention

However, when the metal plate is provided above the transistor, a parasitic capacitance is generated between the transistor and the metal plate. Therefore, a capacitance of the radio-frequency switch in a switch-off state increases so that a loss of the radio-frequency signal in the switch-off state is likely to increase.

Therefore, the present disclosure proposes a switch circuit and a communication apparatus that can improve a withstand voltage and suppress a loss of a radio-frequency signal in a switch-off state.

Solutions to Problems

A switch circuit according to one aspect of the present disclosure includes: a plurality of semiconductor elements connected to each other in series; capacitive elements connected to at least some of the plurality of semiconductor elements; and a resistance element connected between the capacitive elements.

MODE FOR CARRYING OUT THE INVENTION

Hereinafter, embodiments of the present disclosure will be described in detail with reference to the drawings. Note that the same parts will be denoted by the same reference signs in each of the following embodiments, and the redundant description thereof will be omitted.

Note that a description will be given in the following order.

1. Radio-Frequency Switch
1-1. Circuit Configuration
1-2. Operation In Switch-Off State
2. First Embodiment
2-1. Configuration of Radio-Frequency Switch
2-2. First Modified Example
2-3. Second Modified Example
2-4. Third Modified Example
3. Second Embodiment
3-1. Method of Reducing Coupling Capacitance
4. Third Embodiment
4-1. First Switching Process
4-2. Control of First Switching Process
4-3. Second Switching Process
4-4. Control of Second Switching Process
5. Effect

1. Radio-Frequency Switch

Before describing the present disclosure, an overview of a radio-frequency switch according to the present disclosure will be described. In the following description, a description regarding the related art will be omitted as appropriate.

1-1. Circuit Configuration

Figure 1:
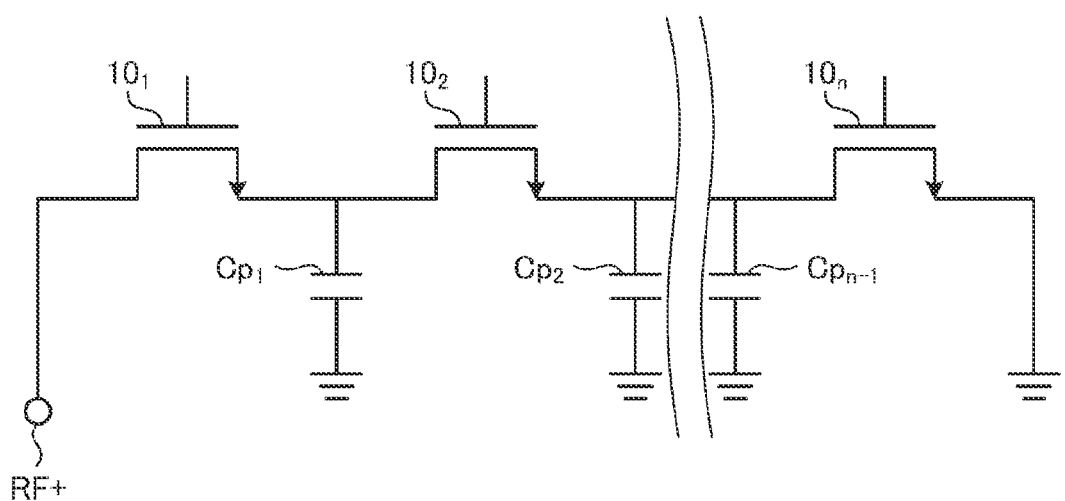
FIG. 1 is a diagram for describing an example of a circuit configuration of a radio-frequency switch including a plurality of transistors.

A circuit configuration of the radio-frequency switch will be described with reference to FIG. 1. FIG. 1 is a diagram for describing an example of the circuit configuration of the radio-frequency switch.

As illustrated in FIG. 1, the radio-frequency switch 1 includes a transistor $10_1$, a transistor $10_2$, . . . , and a transistor $10_n$ (n may be any integer). The transistors $10_1$ to $10_n$ are a kind of semiconductor elements. For example, each of the transistors $10_1$ to $10_n$ is a field effect transistor, but is not limited thereto.

A drain of the transistor $10_1$ is connected to a radio-frequency input terminal RF+. A source of the transistor $10_1$ is connected to a drain of the transistor $10_2$. Parasitic capacitance $Cp_1$ due to a device configuration or the like is equivalently generated between a ground, and the source of the transistor $10_1$ and the drain of the transistor $10_2$. In a case where the number of transistors is n, n-1 parasitic capacitances from the parasitic capacitance $Cp_1$ to a parasitic capacitance $Cp_{n-1}$ are equivalently generated. The radio-frequency switch 1 has a configuration in which a plurality of transistors is connected in series by connecting a source and a drain of adjacent transistors. In other words, the radio-frequency switch 1 has a configuration in which the plurality of transistors is connected in multiple stages. Then, the source of the terminal transistor $10_n$ is grounded, for example, but is not limited thereto.

1-2. Operation In Switch-Off State

Figure 2:
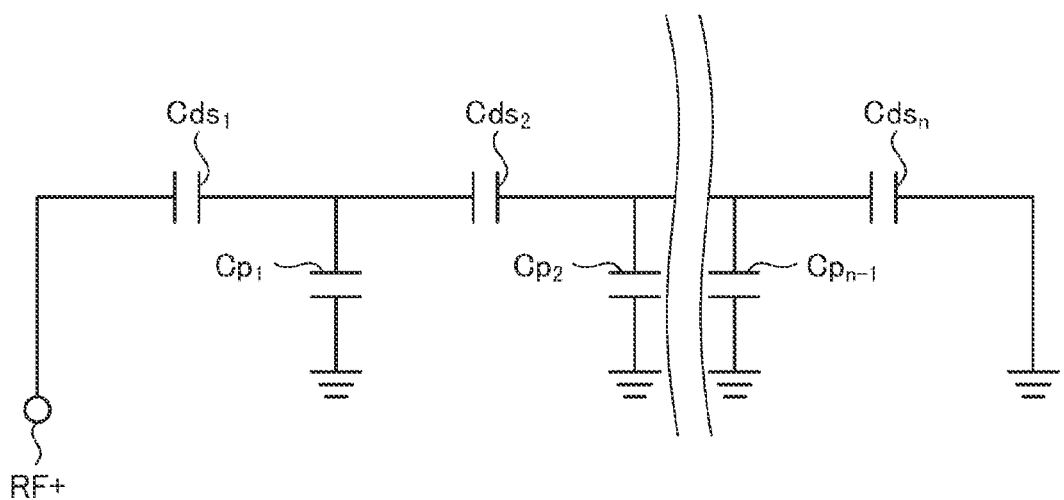
FIG. 2 is a diagram illustrating an equivalent circuit of the radio-frequency switch in a switch-off state.

An operation in a switch-off state of the radio-frequency switch will be described with reference to FIG. 2. FIG. 2 is a diagram illustrating an equivalent circuit in the switch-off state of the radio-frequency switch.

Each of off-capacitances $Cds_1$ to $Cds_n$ is a capacitance between the drain and the source in a switch-off state of each of the transistors $10_1$ to $10_n$. Here, magnitudes of the parasitic capacitance $Cp_1$ to the parasitic capacitance $Cp_{n-1}$ are usually different. Thus, it is assumed that the transistors $10_1$ to $10_n$ have the same gate width. Here, in a case where a radio-frequency signal is input from the input terminal $RF_+$, magnitudes of voltages generated between the drains and sources of the transistors $10_1$ to $10_n$ vary due to effects of $Cp_1$ to $Cp_{n-1}$, respectively.

Figure 3:
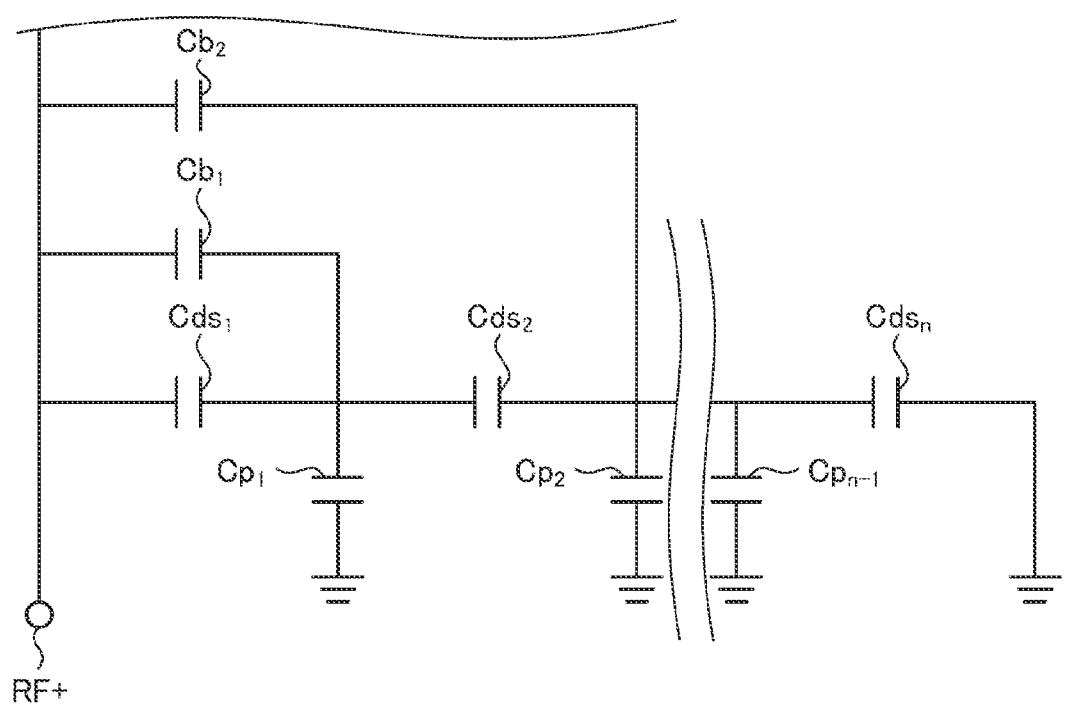
FIG. 3 is a diagram for describing a method of improving resistance of the radio-frequency switch.

It is conceivable to adjust the off-capacitance of each of the transistors $10_1$ to $10_n$ to be apparently the same in order to make the voltage generated between the drain and source of each of the transistors $10_1$ to $10_n$ constant. For example, as illustrated in FIG. 3, a coupling capacitance $Cb_1$ and a coupling capacitance $Cb_2$ are provided to the off-capacitance $Cds_1$ and the off-capacitance $Cds_2$, respectively, to increase the capacitance per transistor stage. The coupling capacitance can be generated, for example, by arranging a metal plate or the like above the transistor to which a relatively high voltage is applied. Furthermore, actual capacitors may be connected to the off-capacitance $Cds_1$ and the off-capacitance $Cds_2$.

Since the magnitude of the voltage generated between the drain and source of each of the transistors $10_1$ to $10_n$ can be made constant by providing the capacitance to each of the transistors, a withstand voltage is improved. However, the capacitance when the entire radio-frequency switch 1 is turned off increases. Therefore, there is a problem that a loss of the radio-frequency signal increases.

Therefore, the present disclosure proposes a method capable of improving the withstand voltage and suppressing the loss of the radio-frequency signal.

2. First Embodiment

2-1. Configuration of Radio-Frequency Switch

Figure 4:
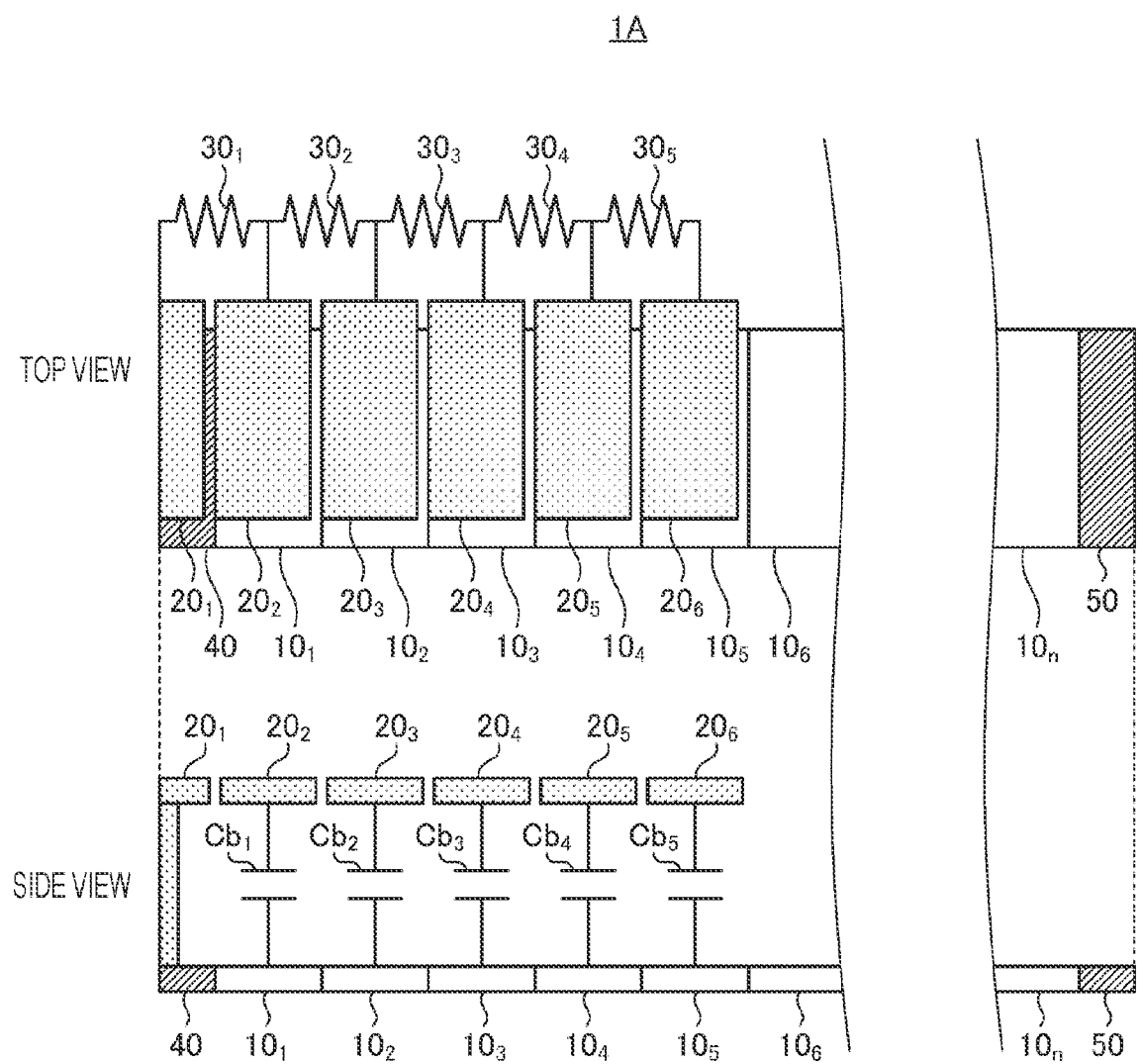
FIG. 4 is a diagram for describing a configuration of a radio-frequency switch according to a first embodiment.

A configuration of a radio-frequency switch according to a first embodiment will be described with reference to FIG. 4. FIG. 4 is a diagram for describing the configuration of the radio-frequency switch according to the first embodiment.

As illustrated in FIG. 4, a radio-frequency switch 1A includes transistors $10_1$ to $10_n$, metal plates $20_1$ to $20_6$, resistance elements $30_1$ to $30_5$, an input electrode 40, and an output electrode 50.

The transistors $10_1$ to $10_n$ are electrically connected in series in multiple stages between the input electrode 40 and the output electrode 50. The number of the transistors is not particularly limited. In a case where it is unnecessary to distinguish the transistors $10_1$ to $10_n$ from each other, the transistors $10_1$ to $10_n$ may be collectively referred to as transistors 10.

The metal plates $20_1$ to $20_6$ are plates made of metal. The metal plate $20_1$ is electrically connected to the input electrode 40. The metal plate $20_1$ receives a radio-frequency signal from the input electrode 40. The metal plate $20_1$ is provided so as to cover the input electrode 40 from above. The metal plates $20_2$ to $20_6$ are provided so as to respectively cover the transistors 101 to 105 from above. In a case where it is unnecessary to distinguish the metal plates $20_1$ to $20_6$ from each other, the metal plates $20_1$ to $20_6$ may be collectively referred to as metal plates 20. The metal plate 20 is provided so as to cover the transistor 10, located on a side close to the input electrode 40, from above. Hereinafter, a description is given assuming that the transistors 10 up to the fifth transistor 10 from the input electrode 40 are covered by the metal plates 20, but this is an example, and the present disclosure is not limited thereto. For example, the number of transistors covered by the metal plates 20 may be any number counted from the input electrode 40.

The resistance element $30_1$ is provided so as to connect the metal plate $20_1$ and the metal plate $20_2$. The resistance element $30_1$ is electrically connected to the metal plate $20_1$ and the metal plate $20_2$. The resistance element $30_2$ is provided so as to connect the metal plate $20_2$ and the metal plate $20_3$. The resistance element $30_2$ is electrically connected to the metal plate $20_2$ and the metal plate $20_3$. The resistance element $30_3$ is provided so as to connect the metal plate $20_3$ and the metal plate $20_4$. The resistance element $30_3$ is electrically connected to the metal plate $20_3$ and the metal plate $20_4$. The resistance element $30_4$ is provided so as to connect the metal plate $20_4$ and the metal plate $20_5$. The resistance element $30_4$ is electrically connected to the metal plate $20_4$ and the metal plate $20_5$. The resistance element $30_5$ is provided so as to connect the metal plate $20_5$ and the metal plate $20_6$. The resistance element $30_5$ is electrically connected to the metal plate $20_5$ and the metal plate $20_6$. That is, the metal plates $20_1$ to $20_6$ are continuously connected by the resistance elements $30_1$ to $30_5$. The resistance element $30_1$ to the resistance element $30_5$ may have any resistance value. The resistance elements $30_1$ to $30_5$ may be insulators.

In a case where it is unnecessary to distinguish the resistance element $30_1$ to the resistance element $30_5$ from each other, the resistance element $30_1$ to the resistance element $30_5$ may be collectively referred to as resistance elements 30.

Coupling capacitances are generated between the transistors $10_1$ to $10_5$ and the metal plates $20_2$ to $20_6$, respectively. A coupling capacitance $Cb_1$ is generated between the transistor $10_1$ and the metal plate $20_2$. A coupling capacitance $Cb_2$ is generated between the transistor $10_2$ and the metal plate $20_3$. A coupling capacitance $Cb_3$ is generated between the transistor $10_3$ and the metal plate $20_4$. A coupling capacitance $Cb_4$ is generated between the transistor $10_4$ and the metal plate $20_5$. A coupling capacitance $Cb_5$ is generated between the transistor $10_5$ and the metal plate $20_6$. The amount of electrical coupling with respect to the input electrode is adjusted by adjusting the resistance values of the resistance elements $30_1$ to $30_5$.

The input electrode 40 is an electrode connected to an input terminal to which the radio-frequency signal is input. The output electrode 50 is an electrode connected to an output terminal from which an output signal of the radio-frequency switch 1A is output.

Figure 5:
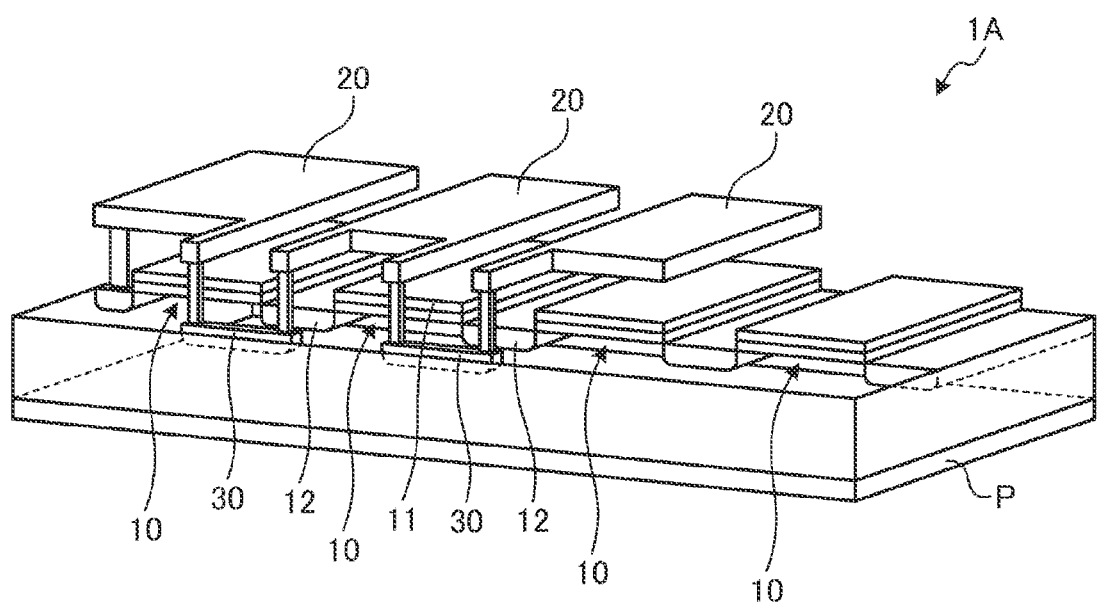
FIG. 5 is a view schematically illustrating a configuration of the radio-frequency switch according to the first embodiment.

A schematic configuration of the radio-frequency switch 1A will be described with reference to FIG. 5. FIG. 5 is a schematic view schematically illustrating the configuration of the radio-frequency switch 1A.

As illustrated in FIG. 5, the transistor 10 is formed on a semiconductor substrate P. The metal plates 20 are provided above the transistors 10. The metal plate 20 is provided so as to cover the transistor 10. The metal plate 20 is provided with a gap with respect to the adjacent metal plate 20. The metal plate 20 and the adjacent metal plate 20 are connected by the resistance element 30. The resistance element 30 may be configured using, for example, a poly resistor stacked on the semiconductor substrate P. For example, a resin used for packaging and sealing a semiconductor may be used as the resistance element 30.

A source of the transistor 10 and a drain of the adjacent transistor 10 are connected by a connection region 12. A parasitic capacitance is generated between a ground, and the source of the transistor 10 and the drain of the adjacent transistor 10. Due to the influence of the parasitic capacitance, an imbalance occurs in a radio-frequency voltage applied to each of the transistors 10 by the input radio-frequency signal.

Figure 6:
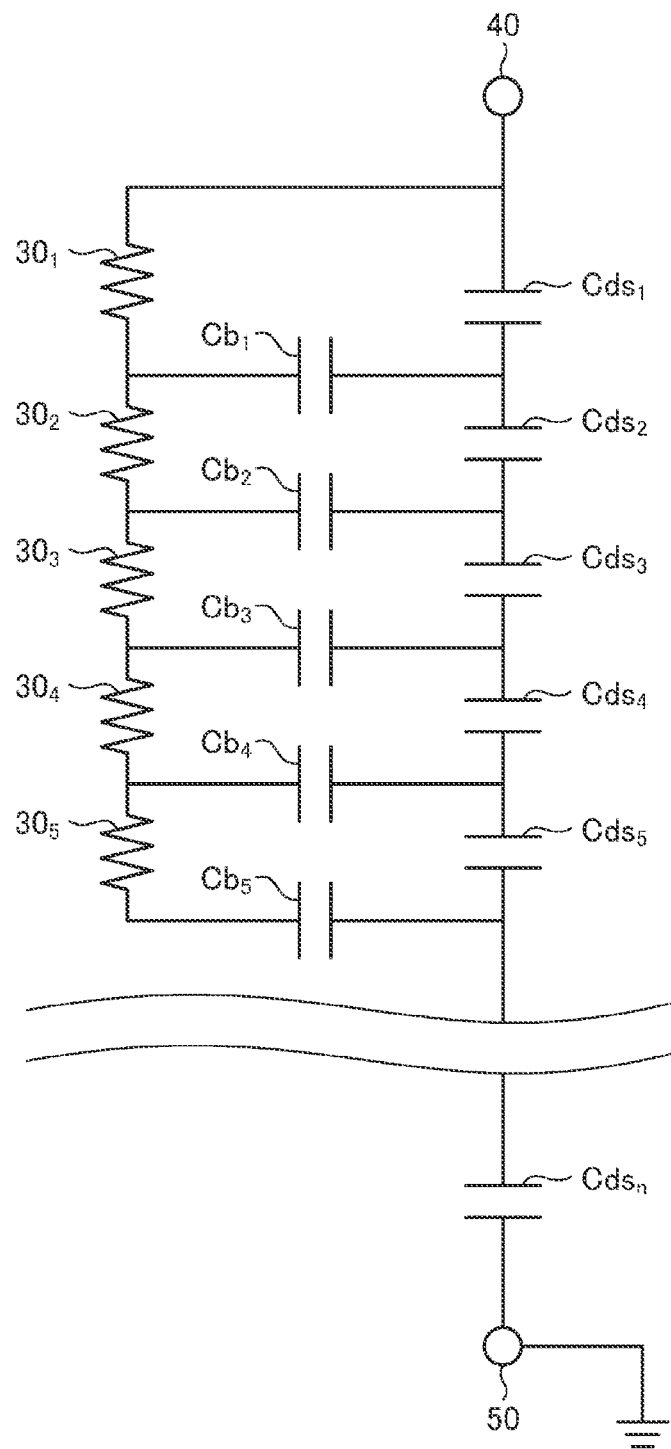
FIG. 6 is a diagram illustrating an equivalent circuit of the radio-frequency switch according to the first embodiment.

A circuit configuration of the radio-frequency switch 1A will be described with reference to FIG. 6. FIG. 6 is a diagram illustrating an equivalent circuit in a switch-off state of the radio-frequency switch 1A whose one side is grounded.

Off-capacitances $Cds_1$ to $Cds_5$ are capacitances in switch-off states of the transistors $10_1$ to $10_5$, respectively. As illustrated in FIG. 6, capacitance values of the coupling capacitance $Cb_1$ to the coupling capacitance $Cb_5$ change depending on values of the resistance element $30_1$ to the resistance element $30_5$. Specifically, when the resistance values of the resistance element $30_1$ to the resistance element $30_5$ are increased, a current flowing through the metal plates 20 decreases, so that an electric field coupling becomes sparse, and an apparent capacitance value decreases. When the resistance values of the resistance elements $30_1$ to $30_5$ are decreased, the current flowing through the metal plates 20 increases, so that the electric field coupling becomes dense, and the apparent capacitance value increases.

For example, in a case where a power value of the radio-frequency signal input from the input electrode 40 is relatively high, it is only required to decrease the resistance values of the resistance element $30_1$ to the resistance element $30_5$ to make the electric field coupling dense in order to improve a withstand voltage. In this case, a larger voltage is applied to a transistor arranged at a position closer to the input electrode 40, and thus, it is preferable to make the resistance value of the resistance element $30_1$ smaller than the resistance values of the resistance elements $30_2$ to $30_5$. For example, the resistance value of the resistance element $30_1$ may be minimized, and the resistance values of the resistance element $30_2$, the resistance element $30_3$, the resistance element $30_4$, and the resistance element $30_5$ may be set to be larger in this order. That is, the resistance value of the resistance element arranged at a position closer to the input electrode 40 may be lowered, and the resistance value of the resistance element arranged at a position farther from the input electrode 40 may be raised.

For example, in a case where the power value of the radio-frequency signal input from the input electrode 40 is relatively low, it is only required to increase the resistance values of the resistance element $30_1$ to the resistance element $30_5$ to make the electric field coupling sparse in order to reduce a loss of the radio-frequency signal.

In the present embodiment, it is only required to determine the resistance values of the resistance element $30_1$ to the resistance element $30_5$ in consideration of a balance between the withstand voltage of the radio-frequency switch 1A and the loss of the radio-frequency signal.

The resistance values of the resistance elements $30_1$ to $30_5$ may be weighted in accordance with withstand voltage performance of the transistors $10_1$ to $10_6$. That is, the resistance values of the resistance element $30_1$ to the resistance element $30_5$ may be different from each other. When the resistance values of the resistance elements $30_1$ to $30_5$ are set according to the withstand voltage performance of the transistors $10_1$ to $10_6$, it is possible to improve the withstand voltage of the radio-frequency switch 1 while suppressing the increase in the apparent capacitance in the switch-off state.

Figure 7:
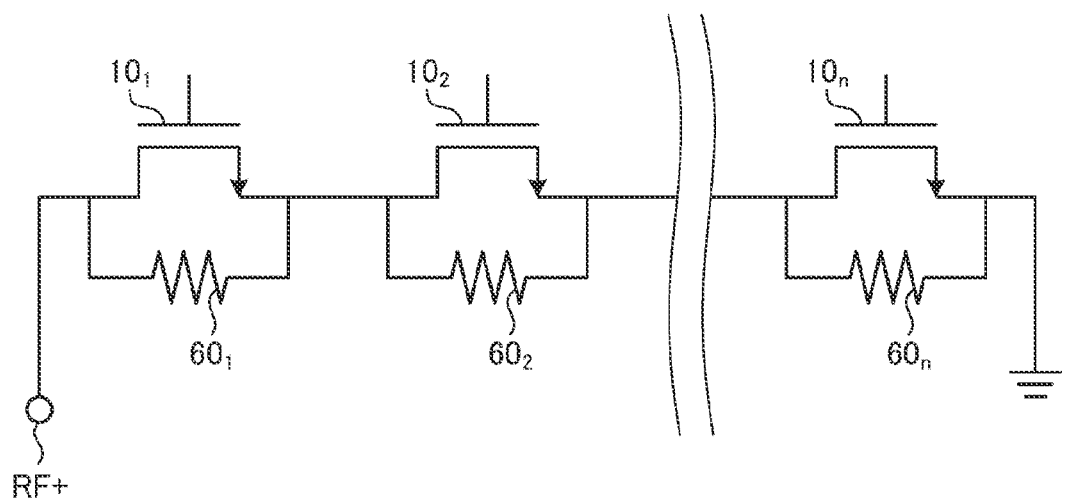
FIG. 7 is a diagram for describing a method of using a resistance element.

The resistance element 30 may also serve as, for example, a resistor connected between the drain and the source of the transistor 10. For example, as illustrated in FIG. 7, a bias resistance element $60_1$, a bias resistance element $60_2$, . . . , and a bias resistance element $60_n$ are connected between the drains and the sources of the transistor $10_1$, the transistor $10_2$, . . . , and the transistor $10_n$, respectively. Each of the bias resistance element $60_1$ to the bias resistance element $60_n$ is a bias resistor configured to supply a bias voltage to the transistor 10 at the next stage. For example, the bias resistance element $60_1$ connected between the drain and source of the transistor $10_1$ is the bias resistor connected to supply the bias voltage to the drain of the transistor $10_2$. Such bias resistance element $60_1$ to the bias resistance element $60_n$ may be used as the resistance elements 30. When the bias resistance element $60_1$ to the bias resistance element $60_n$ are used, it is unnecessary to newly provide the resistance elements 30, and thus, the circuit configuration of the radio-frequency switch 1 can be downsized.

The resistance element 30 may be configured using, for example, a variable resistor. Therefore, the balance between the withstand voltage and the loss of the radio-frequency signal in the radio-frequency switch 1 can be adjusted according to a situation. A method of adjusting the balance between the withstand voltage and the loss of the radio-frequency signal according to the situation will be described later.

2-2. First Modified Example

Figure 8:
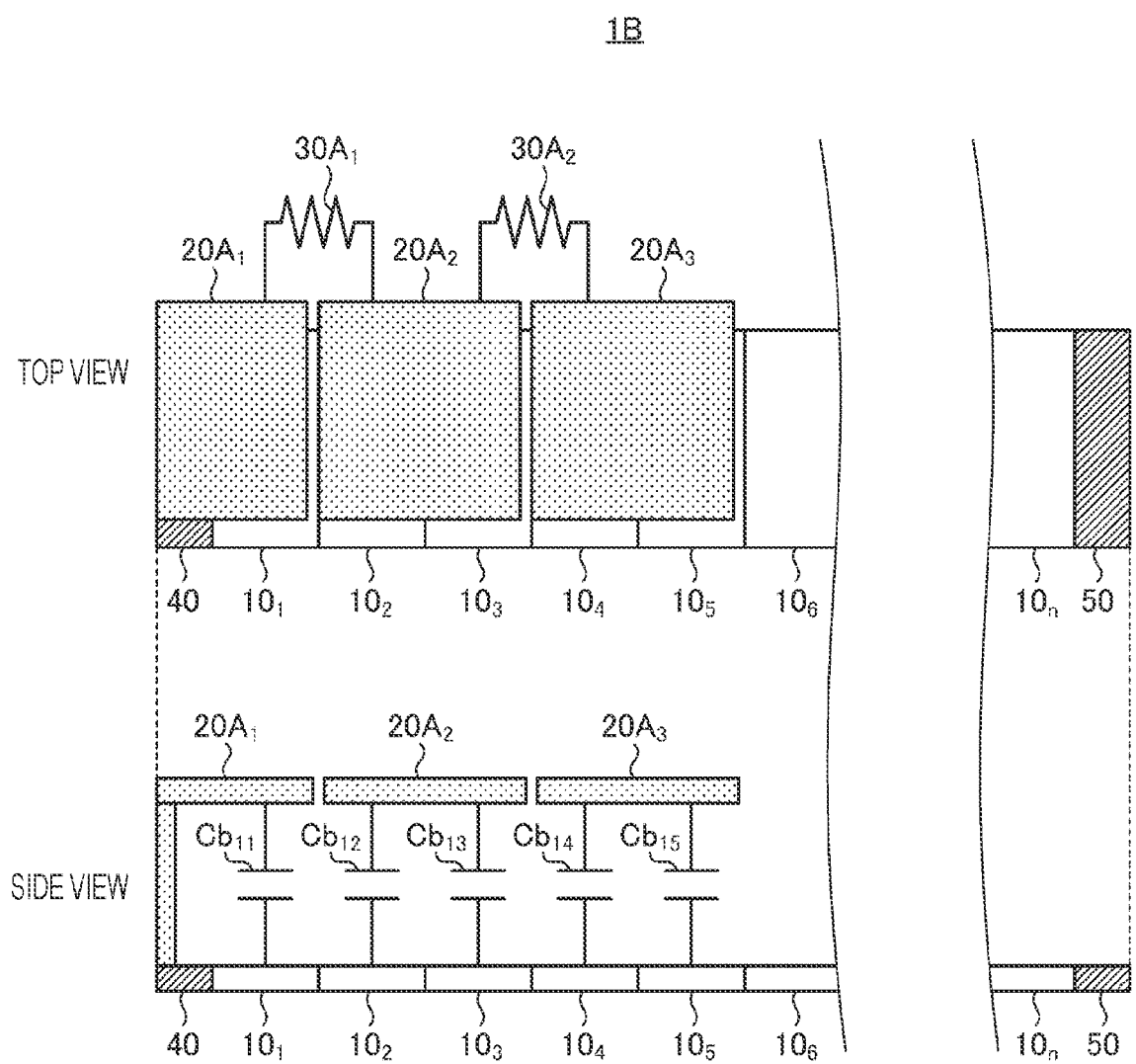
FIG. 8 is a diagram for describing a configuration of a radio-frequency switch according to a first modified example of the first embodiment.

A configuration of a radio-frequency switch according to a first modified example of the first embodiment will be described with reference to FIG. 8. FIG. 8 is a diagram illustrating an example of the configuration of the radio-frequency switch according to the first modified example of the first embodiment.

Although the metal plates 20 are provided above the transistors 10 in a one-to-one manner in the first embodiment, the present disclosure is not limited thereto. For example, the metal plate 20 may be provided so as to cover a plurality of elements.

As illustrated in FIG. 8, a radio-frequency switch 1B includes transistors $10_1$ to $10_n$, metal plates $20A_1$ to $20A_3$, a resistance element $30A_1$, a resistance element $30A_2$, an input electrode 40, and an output electrode 50.

The metal plate $20A_1$ is electrically connected to the input electrode 40. The metal plate $20A_1$ receives a radio-frequency signal from the input electrode 40. The metal plate $20A_1$ is provided so as to cover the input electrode 40 and the transistor $10_1$ from above. The metal plate $20A_2$ is provided so as to cover the transistor $10_2$ and the transistor $10_3$ from above. The metal plate $20A_3$ is provided so as to cover the transistor $10_4$ and the transistor $10_5$ from above. In a case where it is unnecessary to distinguish the metal plates $20A_1$ to $20A_3$ from each other, the metal plates $20A_1$ to $20A_3$ may be collectively referred to as metal plates 20A.

The resistance element $30A_1$ is provided so as to connect the metal plate $20A_1$ and the metal plate $20A_2$. The resistance element $30A_1$ is electrically connected to the metal plate $20A_1$ and the metal plate $20A_2$. The resistance element $30A_2$ is provided so as to connect the metal plate $20A_2$ and the metal plate $20A_3$. The resistance element $30A_2$ is electrically connected to the metal plate $20A_2$ and the metal plate $20A_3$. In a case where it is unnecessary to distinguish the resistance element $30A_1$ and the resistance element $30A_2$ from each other, the resistance element $30A_1$ and the resistance element $30A_2$ may be collectively referred to as resistance elements 30A.

A coupling capacitance $Cb_{11}$ is generated between the transistor $10_1$ and the metal plate $20A_1$. A coupling capacitance $Cb_{12}$ is generated between the transistor $10_2$ and the metal plate $20A_2$. A coupling capacitance $Cb_{13}$ is generated between the transistor $10_3$ and the metal plate $20A_2$. A coupling capacitance $Cb_{14}$ is generated between the transistor $10_4$ and the metal plate $20A_3$. A coupling capacitance $Cb_{15}$ is generated between the transistor $10_5$ and the metal plate $20A_3$.

In the first modified example according to the first embodiment, the coupling capacitance $Cb_{11}$ to the coupling capacitance $Cb_{15}$ are added by providing three metal plates of the metal plate $20A_1$ to the metal plate $20A_3$ above the transistors $10_1$ to $10_5$. That is, an increase in capacitance in a switch-off state can be suppressed even by providing the metal plates 20A so as to cover the plurality of transistors 10 and connecting the metal plates 20A by the resistance elements 30A. Therefore, it is possible to improve a withstand voltage and suppress a loss of the radio-frequency signal in the switch-off state.

2-3. Second Modified Example

Figure 9:
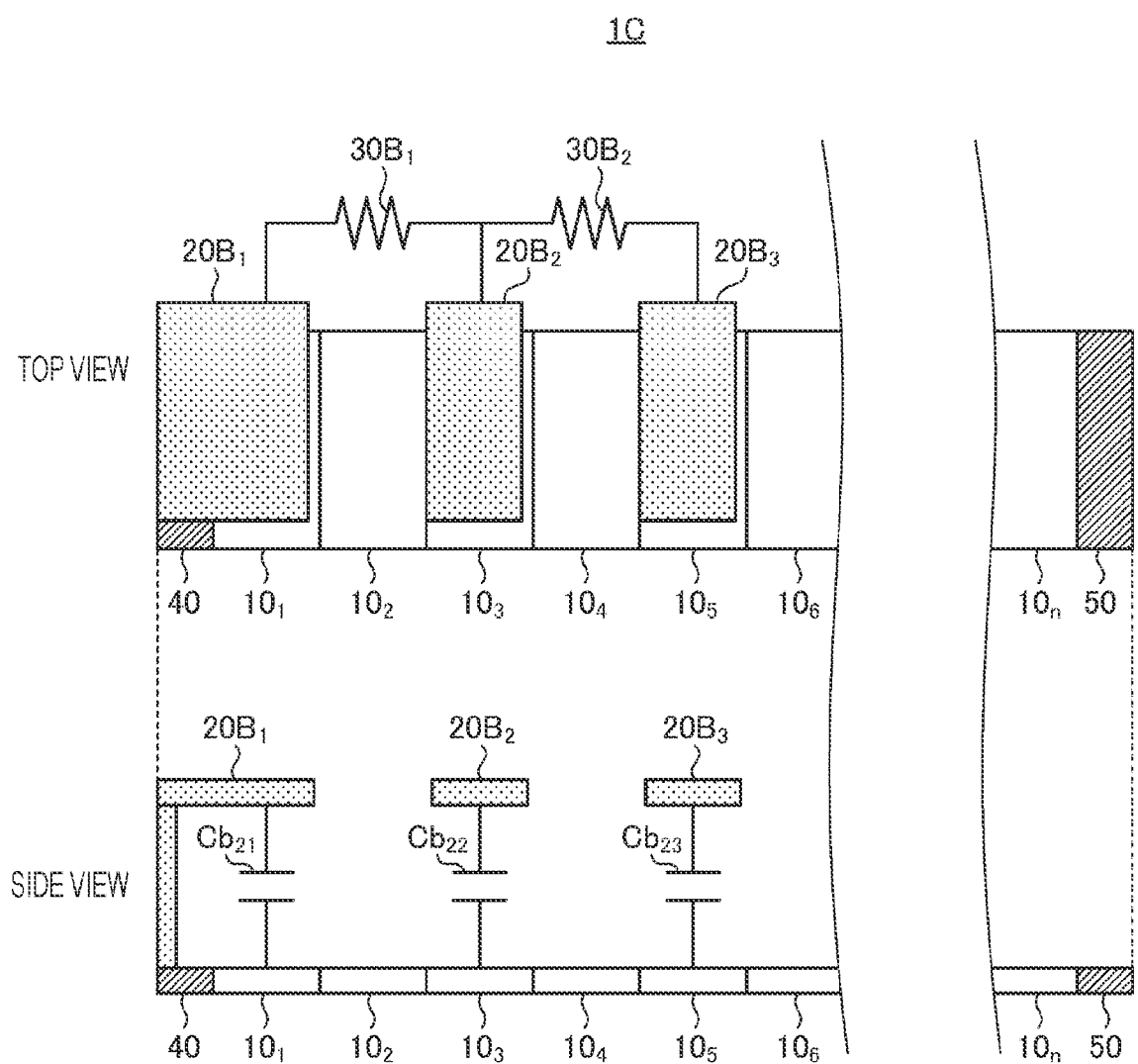
FIG. 9 is a diagram for describing a configuration of a radio-frequency switch according to a second modified example of the first embodiment.

A configuration of a radio-frequency switch according to a second modified example of the first embodiment will be described with reference to FIG. 9. FIG. 9 is a diagram illustrating an example of the configuration of the radio-frequency switch according to the second modified example of the first embodiment.

Although the metal plates 20 are provided above the transistors 10 in a one-to-one manner in the first embodiment, the present disclosure is not limited thereto. For example, the transistor 10 that is not covered by the metal plate 20 may exist among the transistors $10_1$ to $10_5$.

As illustrated in FIG. 9, a radio-frequency switch 1C includes transistors $10_1$ to $10_n$, metal plates $20B_1$ to $20B_3$, a resistance element $30B_1$, a resistance element $30B_2$, an input electrode 40, and an output electrode 50.

The metal plate $20B_1$ is electrically connected to the input electrode 40. The metal plate $20B_1$ receives a radio-frequency signal from the input electrode 40. The metal plate $20B_1$ is provided so as to cover the input electrode 40 and the transistor $10_1$ from above. The metal plate $20B_2$ is provided so as to cover the transistor $10_3$ from above. The metal plate $20B_3$ is provided so as to cover the transistor $10_5$ from above. In a case where it is unnecessary to distinguish the metal plates $20B_1$ to $20B_3$ from each other, the metal plates $20B_1$ to $20B_3$ may be collectively referred to as metal plates 20B.

The resistance element $30B_1$ is provided so as to connect the metal plate $20B_1$ and the metal plate $20B_2$. The resistance element $30B_1$ is electrically connected to the metal plate $20B_1$ and the metal plate $20B_2$. The resistance element $30B_2$ is provided so as to connect the metal plate $20B_2$ and the metal plate $20B_3$. The resistance element $30B_2$ is electrically connected to the metal plate $20B_2$ and the metal plate $20B_3$. In a case where it is unnecessary to distinguish the resistance element $30B_1$ and the resistance element $30B_2$ from each other, the resistance element $30B_1$ and the resistance element $30B_2$ may be collectively referred to as resistance elements 30B.

A coupling capacitance $Cb_{21}$ is generated between the transistor $10_1$ and the metal plate $20B_1$. A coupling capacitance $Cb_{22}$ is generated between the transistor $10_3$ and the metal plate $20B_2$. A coupling capacitance $Cb_{23}$ is generated between the transistor $10_5$ and the metal plate $20B_3$. That is, the coupling capacitances are added to the transistor $10_1$, the transistor $10_3$, and the transistor $10_5$ in the second modified example.

In the second modified example according to the first embodiment, the coupling capacitance $Cb_{21}$ to the coupling capacitance $Cb_{23}$ are added by providing the metal plate $20B_1$, the metal plate $20B_2$, and the metal plate $20B_3$ above the transistor $10_1$, the transistor $10_3$, and the transistor $10_5$, respectively. That is, the coupling capacitances are not necessarily added to all the transistors 10 included in the radio-frequency switch 1C in the present disclosure. Even with such a configuration, it is possible to improve a withstand voltage and suppress a loss of the radio-frequency signal in a switch-off state.

2-4. Third Modified Example

Figure 10:
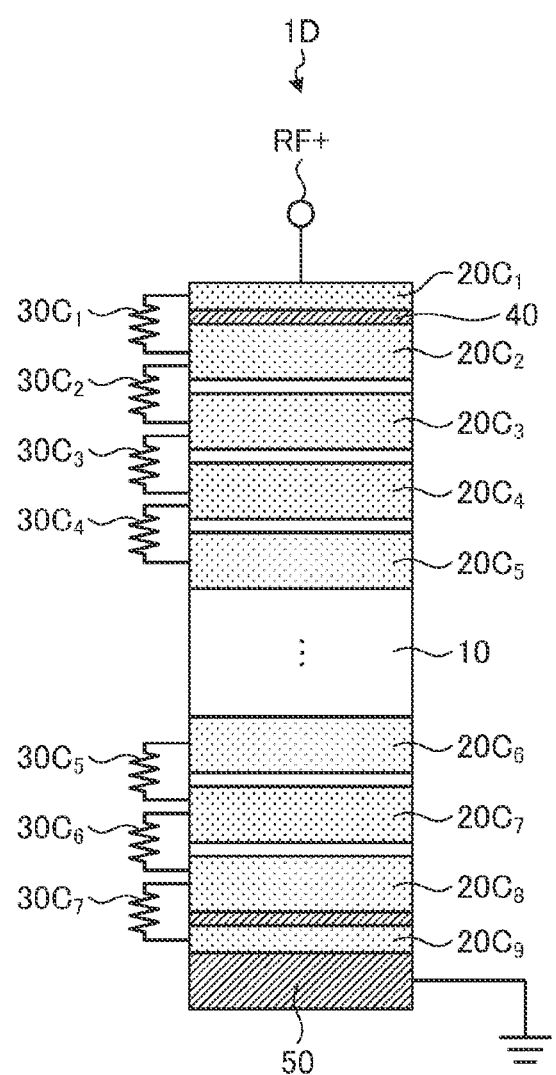
FIG. 10 is a diagram for describing a configuration of a radio-frequency switch according to a third modified example of the first embodiment.

A radio-frequency switch according to a third modified example of the first embodiment will be described with reference to FIG. 10. FIG. 10 is a diagram illustrating a configuration of the radio-frequency switch according to the third modified example of the first embodiment.

As illustrated in FIG. 10, a radio-frequency switch 1D includes a plurality of transistors 10 (transistors $10_1$ to $10_n$), metal plates $20C_1$ to $20C_9$, resistance elements $30C_1$ to $30C_7$, an input electrode 40, and an output electrode 50. The radio-frequency switch 1C is different from the radio-frequency switch 1A illustrated in FIG. 4 in that the output electrode 50 is grounded and the metal plates 20 are provided on the output electrode 50 side. In a case where it is unnecessary to distinguish the metal plates $20C_1$ to $20C_9$ from each other, the metal plates $20C_1$ to $20C_9$ may be collectively referred to as metal plates 20C. In a case where it is unnecessary to distinguish the resistance element $30C_1$ to the resistance element $30C_7$ from each other, the resistance element $30C_1$ to the resistance element $30C_7$ may be collectively referred to as resistance elements 30C.

The metal plates $20C_1$ to $20C_5$ are provided on the input electrode 40 side. The metal plates $20C_1$ to $20C_5$ and the resistance elements $30C_1$ to $30C_4$ have the similar configurations as those of the metal plates $20_1$ to $20_5$ and the resistance elements $30_1$ to $30_4$ illustrated in FIG. 4, respectively.

The metal plates $20C_6$ to $20C_9$ are provided on the output electrode 50 side. The metal plate $20C_9$ is electrically connected to the output electrode 50. The metal plate $20C_9$ is provided so as to cover an upper portion of the output electrode 50. The metal plate $20C_8$ is provided so as to cover an upper portion of the first transistor 10 from the output electrode 50. The metal plate $20C_7$ is provided so as to cover an upper portion of the second transistor 10 from the output electrode 50. The metal plate $20C_6$ is provided so as to cover an upper portion of the third transistor from the output electrode 50.

The resistance element $30C_5$ is provided so as to connect the metal plate $20C_6$ and the metal plate $20C_7$. The resistance element $30C_5$ is electrically connected to the metal plate $20C_6$ and the metal plate $20C_7$. The resistance element $30C_6$ is provided so as to connect the metal plate $20C_7$ and the metal plate $20C_8$. The resistance element $30C_6$ is electrically connected to the metal plate $20C_7$ and the metal plate $20C_8$. The resistance element $30C_7$ is provided so as to connect the metal plate $20C_8$ and the metal plate $20C_9$.

In a case where the output electrode 50 is grounded as in the radio-frequency switch 1D, a bias may occur in a voltage between a drain and a source of the transistor 10 arranged on the output electrode 50 side. Even in such a case, it is possible to equalize a voltage balance by providing the metal plates 20C on the upper portions of the transistors 10 arranged on the output electrode 50 side to add coupling capacitances. An electric field coupling can be made sparse by connecting the metal plates 20C provided on the upper portions of the transistors 10, arranged on the output electrode 50 side, through the resistance elements 30C.

Figure 11:
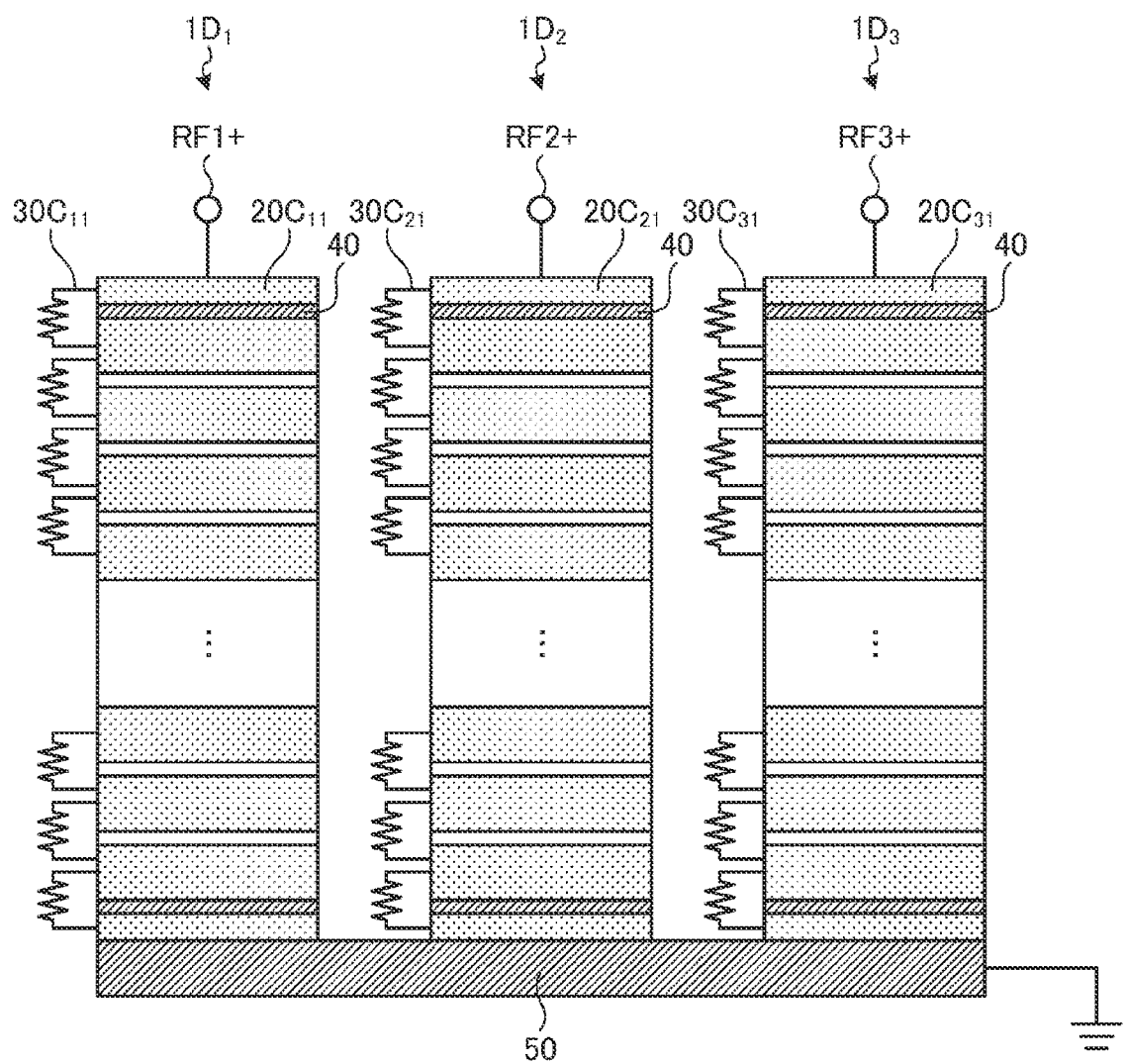
FIG. 11 is a diagram for describing a method of making an electric field coupling among radio-frequency switches sparse.

Furthermore, a radio-frequency switch $1D_1$, a radio-frequency switch $1D_2$, and a radio-frequency switch $1D_3$ may be arranged adjacent to each other as illustrated in FIG. 11. The radio-frequency switches $1D_1$ to $1D_3$ have the same configuration as the radio-frequency switch 1D illustrated in FIG. 10.

The radio-frequency switch $1D_1$ includes a plurality of metal plates $20C_{11}$ and a plurality of resistance elements $30C_{11}$ connecting the plurality of metal plates $20C_{11}$ to each other. The radio-frequency switch $1D_2$ includes a plurality of metal plates $20C_{21}$ and a plurality of resistance elements $30C_{21}$ connecting the plurality of metal plates $20C_{21}$ to each other. The radio-frequency switch $1D_3$ includes a plurality of metal plates $20C_{31}$ and a plurality of resistance elements $30C_{31}$ connecting the plurality of metal plates $20C_{31}$ to each other.

In the example illustrated in FIG. 11, the plurality of metal plates $20C_{11}$ is connected by the resistance elements $30C_{11}$, and the plurality of metal plates $20C_{21}$ is connected by the resistance elements $30C_{21}$, and thus, an electric field coupling between the metal plate $20C_{11}$ and the metal plate $20C_{21}$ can be made sparse. Similarly, the metal plates $20C_{21}$ are connected by the resistance elements $30C_{21}$, and the metal plates $20C_{31}$ are connected by the resistance elements $30C_{31}$, and thus, an electric field coupling between the metal plate $20C_{21}$ and the metal plate $20C_{31}$ can be made sparse. In this manner, an electric field coupling among the radio-frequency switches can be made sparse in the case where the radio-frequency switches $1C_1$ to $1C_3$ are arranged adjacent to each other.

3. Second Embodiment

Although the electric field couplings inside the radio-frequency switch and between the radio-frequency switches are made sparse in the first embodiment, the present disclosure is not limited thereto. The present disclosure can also make an electric field coupling between a radio-frequency switch and another electronic component sparse.

3-1. Method of Reducing Coupling Capacitance

Figure 12:
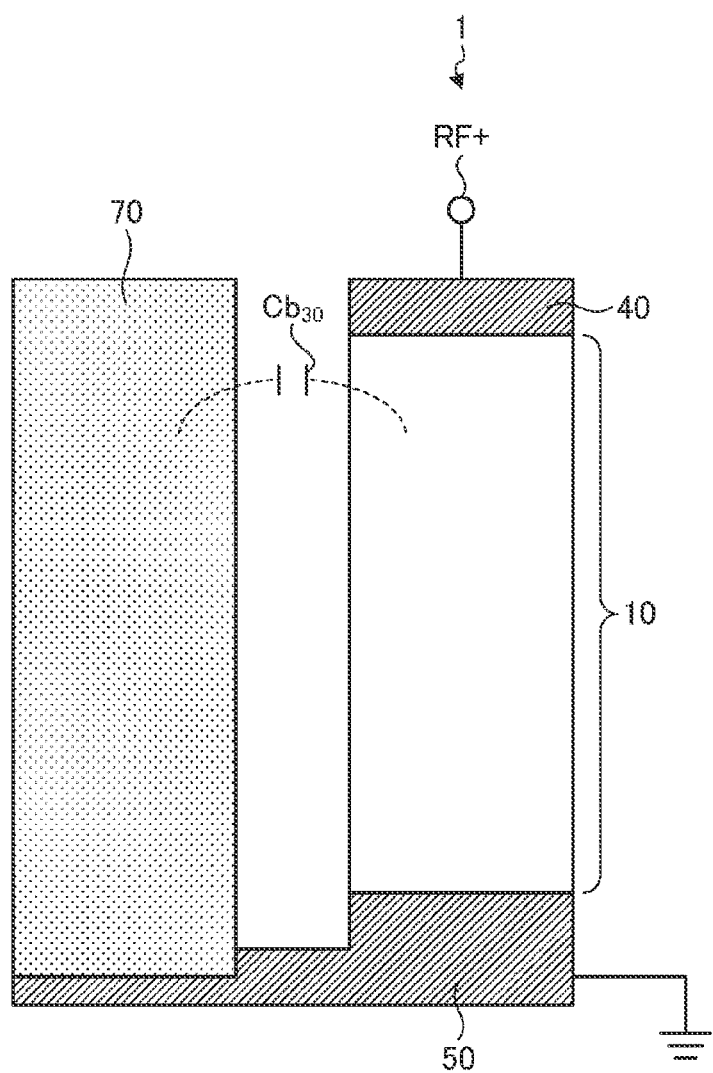
FIG. 12 is a diagram for describing a method of making an electric field coupling sparse according to a second embodiment.
Figure 13:
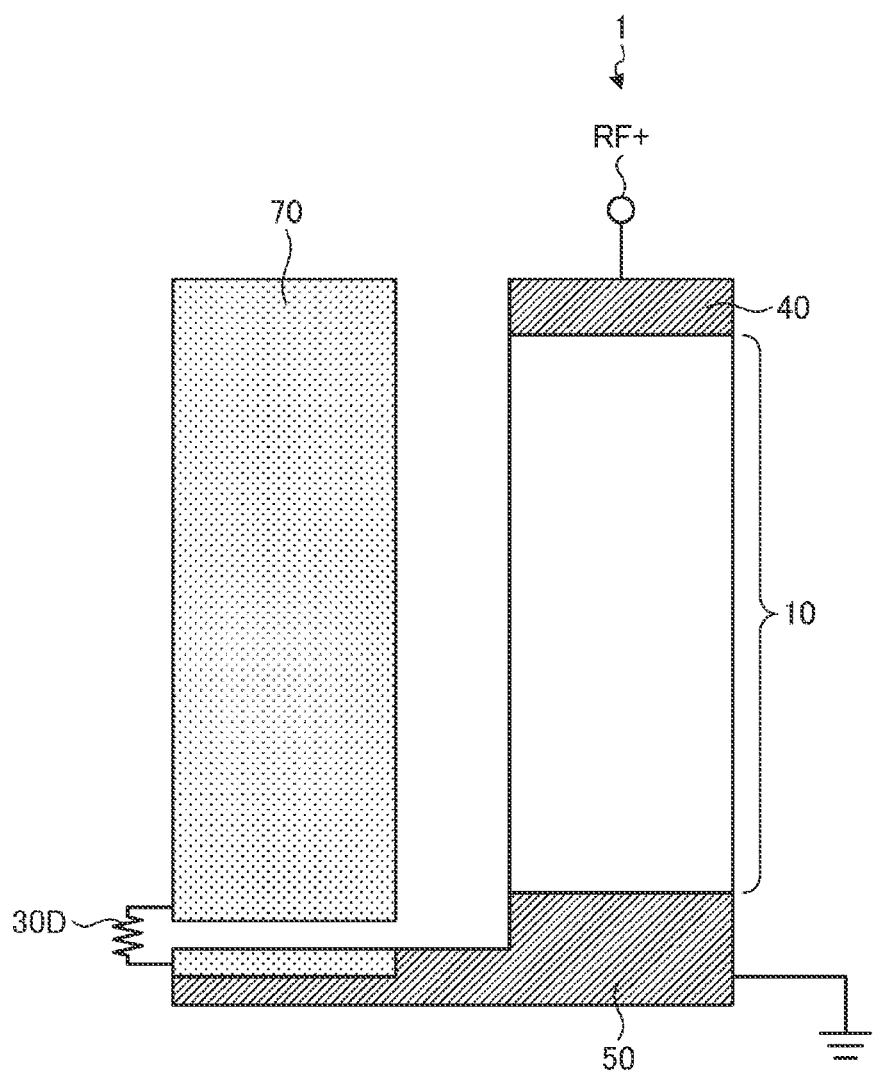
FIG. 13 is a diagram for describing the method of making the electric field coupling sparse according to the second embodiment.

A method of making an electric field coupling sparse according to a second embodiment will be described with reference to FIGS. 12 and 13. FIGS. 12 and 13 are diagrams for describing the method of making the electric field coupling sparse according to the second embodiment.

As illustrated in FIG. 12, a conductor shield 70 may be arranged adjacent to a radio-frequency switch 1. The conductor shield 70 is arranged, for example, for the purpose of protecting a logic circuit arranged in the vicinity of the radio-frequency switch 1 from electromagnetic waves or the like. The radio-frequency switch 1 and the conductor shield 70 share a ground terminal through the output electrode 50. In this case, a coupling capacitance $Cb_{30}$ is generated between a transistor 10 and the conductor shield 70.

As illustrated in FIG. 13, in the present embodiment, in a case where the conductor shield 70 is arranged adjacent to the radio-frequency switch 1, the conductor shield 70 is connected to a ground via a resistance element 30D. Therefore, an electrical coupling between the transistor 10 and the conductor shield 70 is reduced, and thus, an electric field coupling between the transistor 10 and the conductor shield 70 can be made sparse.

4. Third Embodiment

Next, a third embodiment of the present disclosure will be described. The radio-frequency switch according to the present disclosure can be applied to, for example, an antenna of a communication apparatus such as a mobile phone. In this case, a variable resistor is connected to a metal plate of the radio-frequency switch. Therefore, for example, a balance between a withstand voltage and a parasitic capacitance can be adjusted according to a situation and according to a communication situation of the communication apparatus.

4-1. First Switching Process

Figure 14:
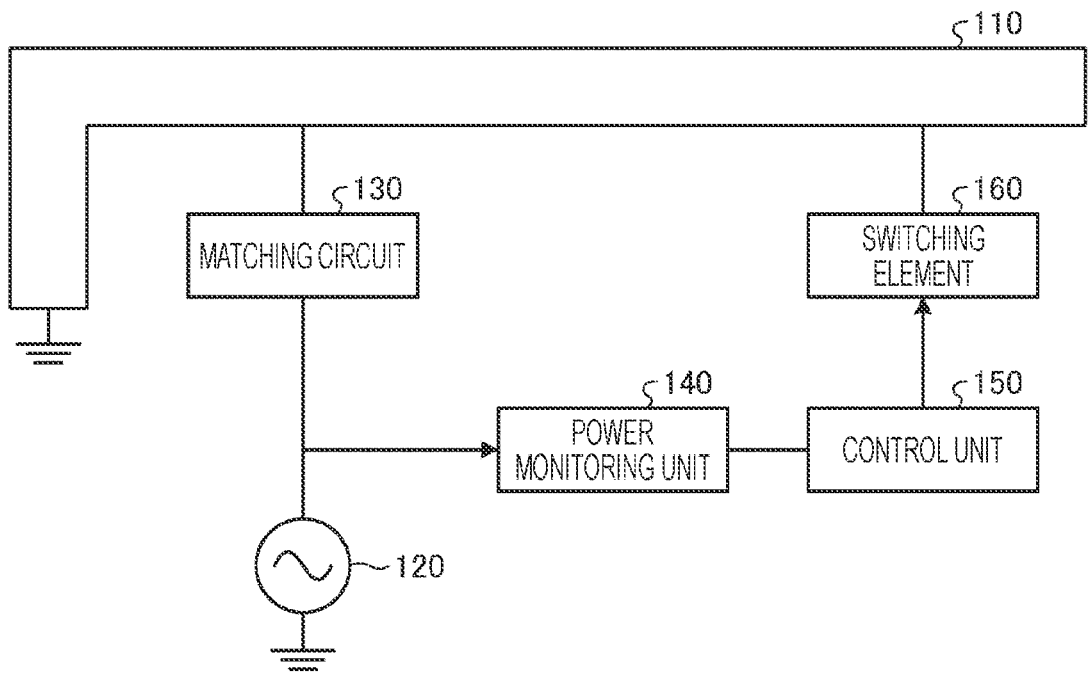
FIG. 14 is a diagram for describing a first switching process according to a third embodiment.

A first switching process in a case where a radio-frequency switch is applied to a communication apparatus will be described with reference to FIG. 14. FIG. 14 is a diagram for describing the first switching process.

As illustrated in FIG. 14, a communication apparatus 100 includes an emitter 110, a signal source 120, a matching circuit 130, a power monitoring unit 140, a control unit 150, and a switching element 160. In FIG. 14, a configuration element that is less relevant to the present disclosure is omitted.

The emitter 110 outputs a radio-frequency signal toward the outside of the communication apparatus 100. The emitter 110 receives a radio-frequency signal entering the communication apparatus 100 from the outside.

The signal source 120 supplies power to the emitter 110. The signal source 120 supplies transmission power for the emitter 110 to transmit the radio-frequency signal to the outside. The transmission power may also be referred to as input power.

The matching circuit 130 is a circuit that matches an output impedance with respect to a subsequent circuit (not illustrated) connected to the emitter 110 with an input impedance of the emitter 110.

The power monitoring unit 140 monitors the power supplied from the signal source 120. The power monitoring unit 140 monitors a magnitude of the transmission power supplied from the signal source 120 to the emitter 110. The power monitoring unit 140 outputs a monitoring result of power to the control unit 150.

The control unit 150 is implemented by, for example, a central processing unit (CPU), a micro processing unit (MPU), or the like executing a program stored in a storage unit (not illustrated) using a RAM or the like as a work area. Furthermore, the control unit 150 is a controller, and may be implemented by, for example, an integrated circuit such as an application specific integrated circuit (ASIC) or a field programmable gate array (FPGA).

The control unit 150 controls the switching element 160. The control unit 150 controls a resistance value of a variable resistor included in the switching element 160. The control unit 150 controls the resistance value of the variable resistor included in the switching element 160 on the basis of a monitoring result of the transmission power by the power monitoring unit 140. Specifically, in a case where the transmission power exceeds a predetermined threshold, the control unit 150 relatively decreases the resistance value of the variable resistor to improve a withstand voltage. In a case where the transmission power is less than the predetermined threshold, the control unit 150 relatively increases the resistance value of the variable resistor to make an electric field coupling sparse.

The switching element 160 is arranged on the emitter 110. The switching element 160 switches a frequency band of a radio wave transmitted and received by the emitter 110. The switching element 160 can be implemented using the radio-frequency switch according to each of the embodiments of the present disclosure. For example, in a case where the switching element 160 is implemented by the radio-frequency switch 1A illustrated in FIG. 4, the resistance element $30_1$ to the resistance element $30_5$ are configured using variable resistors.

4-2. Control of First Switching Process

Figure 15:
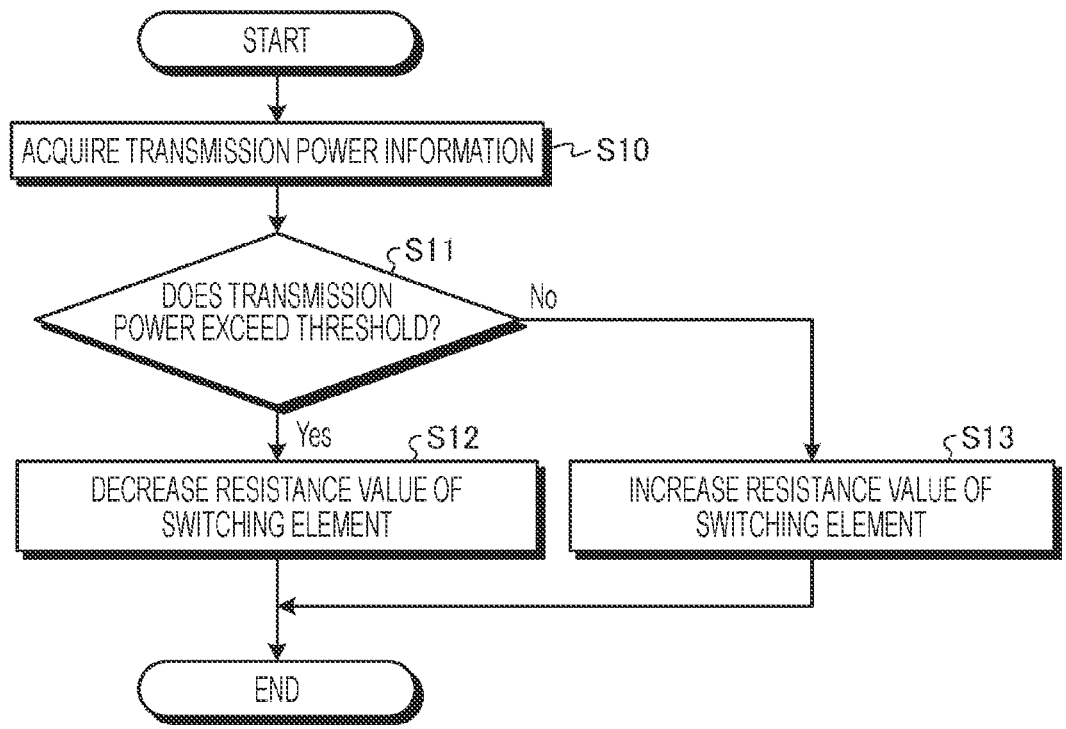
FIG. 15 is a flowchart illustrating a flow of control of the first switching process according to the third embodiment.

A flow of control of the first switching process according to the third embodiment will be described with reference to FIG. 15. FIG. 15 is a flowchart illustrating the flow of control of the first switching process according to the third embodiment.

The control unit 150 acquires transmission power information (step S10). Specifically, the control unit 150 acquires, from the power monitoring unit 140, the transmission power information including information regarding the magnitude of the transmission power supplied from the signal source 120 to the emitter 110. Then, the process proceeds to step S11.

The control unit 150 determines whether or not the magnitude of the transmission power exceeds the threshold (step S11). Specifically, the control unit 150 determines whether or not the magnitude of the transmission power exceeds the threshold on the basis of the acquired transmission power information. In a case where it is determined that the magnitude of the transmission power exceeds the threshold (step S11; Yes), the process proceeds to step S12. In a case where it is determined that the magnitude of the transmission power does not exceed the threshold (step S11; No), the process proceeds to step S13.

In a case where it is determined as Yes in step S11, the control unit 150 decreases a resistance value of the switching element 160 (step S12). Specifically, the control unit 150 decreases the resistance value of the variable resistor of the switching element 160 to improve withstand voltage performance of the switching element 160. Then, the process of FIG. 15 ends.

On the other hand, in a case where it is determined as No in step S11, the control unit 150 increases the resistance value of the switching element 160 (step S13). Specifically, the control unit 150 increases the resistance value of the variable resistor of the switching element 160 to make an electric field coupling in a switch-off state of the switching element 160 sparse. Then, the process in FIG. 15 is continued or ended.

Note that the control unit 150 may control the resistance value of the switching element 160 according to a communication scheme of the communication apparatus 100. For example, in a case where the communication scheme of the communication apparatus 100 is time division duplex (TDD), the control unit 150 can adjust the balance of the withstand voltage performance of the switching element 160 by performing control to lower the resistance value of the switching element 160 during transmission and raise the resistance value of the switching element 160 during reception.

For example, the control unit 150 may control the resistance value of the switching element 160 according to a magnitude of reflected power from an antenna of the communication apparatus 100. For example, the control unit 150 may perform control to lower the resistance value of the switching element 160 in a case where the magnitude of the reflected power exceeds a predetermined threshold, and raise the resistance value of the switching element 160 in a case where the magnitude of the reflected power is less than a predetermined threshold.

For example, in a case where an illuminance sensor is provided in the vicinity of an antenna of the communication apparatus 100, the control unit 150 may control the resistance value of the switching element 160 according to a value of the illuminance sensor.

Figure 16:
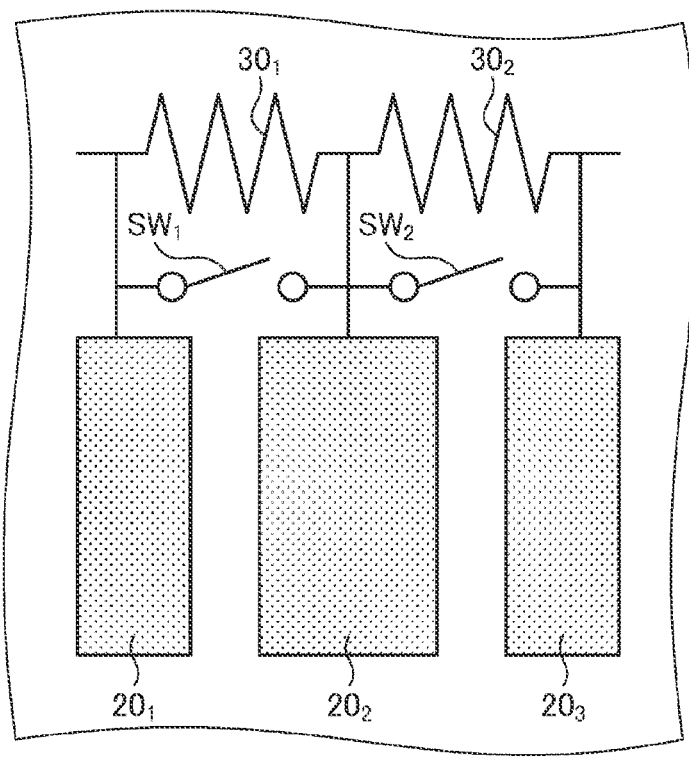
FIG. 16 is a diagram for describing another method of making the electric field coupling sparse.

Furthermore, the description has been given assuming that the switching element 160 includes the variable resistor as a method of changing an apparent capacitance of the switching element 160, but the present disclosure is not limited thereto. For example, as illustrated in FIG. 16, in a case where the switching element 160 is implemented by the radio-frequency switch 1A illustrated in FIG. 4, a switch may be arranged with respect to the resistance element 30 connected to the metal plate 20. In the example illustrated in FIG. 16, a switch $SW_1$ is connected in parallel to the resistance element $30_1$, and a switch $SW_2$ is connected in parallel to the resistance element $30_2$. For example, the metal plate $20_1$ and the metal plate $20_2$ are electrically connected in a closed state of the switch $SW_1$. The metal plate $20_2$ and the metal plate $20_3$ are electrically connected in a closed state of the switch $SW_2$. Hereinafter, in a case where it is unnecessary to distinguish the switch $SW_1$ and the switch $SW_2$ from each other, the switch $SW_1$ and the switch $SW_2$ may be collectively referred to as switches SW.

In the example illustrated in FIG. 16, the control unit 150 controls opening and closing of the switch $SW_1$ and the switch $SW_2$ on the basis of the transmission power information. For example, the control unit 150 turns the switch $SW_1$ into the closed state to electrically connect the metal plate $20_1$ and the metal plate $20_2$. Therefore, an electrical coupling between each of the metal plate $20_1$ and the metal plate $20_2$ and the transistor 10 become strong, and thus, an electric field coupling become dense. In other words, the control unit 150 controls the switch SW to be turned into the closed state, whereby the electric field coupling in the switching element 160 can be made dense. That is, the control unit 150 can improve the withstand voltage of the switching element 160 by controlling the opening and closing of the switch SW on the basis of the transmission power information.

The control unit 150 may control opening and closing of the switch SW according to the communication scheme of the communication apparatus 100. For example, in a case where the communication scheme of the communication apparatus 100 is the TDD scheme, the control unit 150 can improve the withstand voltage of the switching element 160 and suppress a loss of the radio-frequency signal in the switch-off state by controlling the switch SW to be in the closed state during transmission and controlling the switch SW to be in an open state during reception.

For example, the control unit 150 may control the switch SW according to a magnitude of reflected power from an antenna of the communication apparatus 100. For example, the control unit 150 controls the switch SW to be in the closed state in a case where the magnitude of the reflected power exceeds a predetermined threshold, and controls the switch SW to be in the open state in a case where the magnitude of the reflected power is less than the predetermined threshold.

For example, in a case where an illuminance sensor is provided in the vicinity of an antenna of the communication apparatus 100, the control unit 150 may control the switch SW according to a value of the illuminance sensor.

4-3. Second Switching Process

Figure 17:
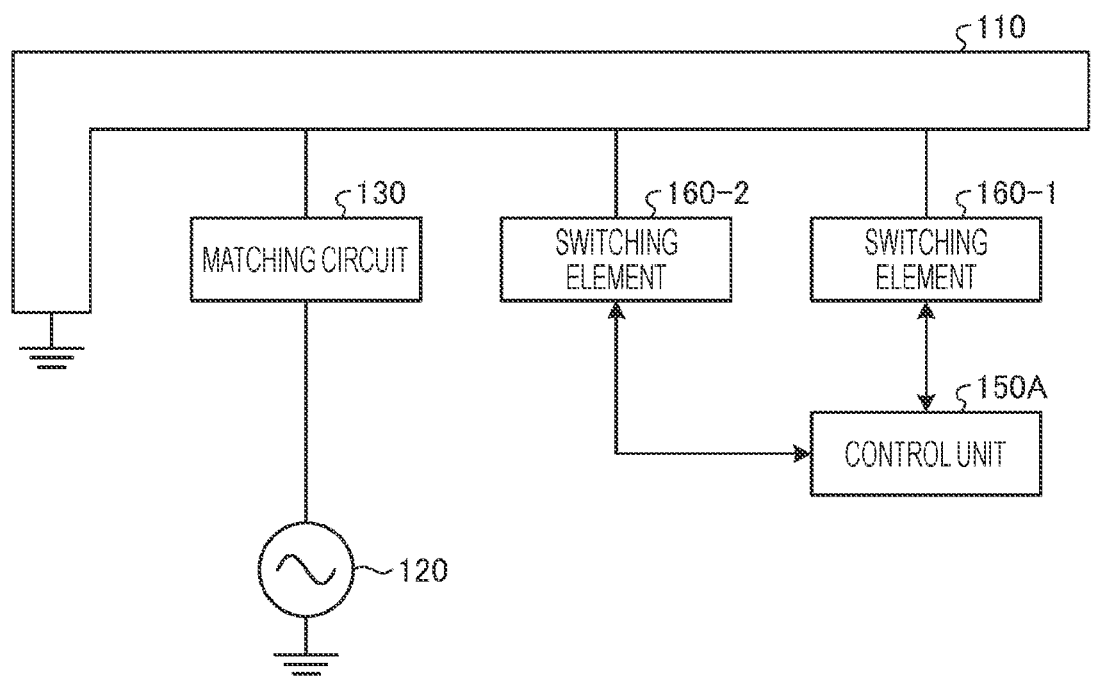
FIG. 17 is a diagram for describing a second switching process according to the third embodiment.

A second switching process in a case where a radio-frequency switch is applied to a communication apparatus will be described with reference to FIG. 17. FIG. 17 is a diagram for describing the second switching process.

As illustrated in FIG. 17, a communication apparatus 100A includes an emitter 110, a signal source 120, a matching circuit 130, a control unit 150A, a switching element 160-1, and a switching element 160-2. In FIG. 17, a configuration element that is less relevant to the present disclosure is omitted.

There is known a band adjustment method (aperture tuning) of arranging a plurality of switching elements on the emitter 110 to switch reactance in order to transmit and receive a radio-frequency signal in a high band in the communication apparatus 100A. In a case where the plurality of switching elements is connected to the emitter 110, voltages related to the switching elements change depending on a position connected to the emitter 110. Therefore, a resistance value of the switching element is controlled according to the position on the emitter 110 in the present embodiment.

The control unit 150A controls the switching element 160-1 and the switching element 160-2. The control unit 150A controls a resistance value of each of variable resistors provided in the switching element 160-1 and the switching element 160-2. In the emitter 110, the control unit 150A controls resistance values of the switching element 160-1 and the switching element 160-2 according to positions where the switching element 160-1 and the switching element 160-2 are arranged. Specifically, the control unit 150A sets the resistance value of the switching element 160-1 to be lower than the resistance value of the switching element 160-2.

The switching element 160-1 and the switching element 160-2 are arranged on the emitter 110. The switching element 160-1 and the switching element 160-2 can be implemented using the radio-frequency switch according to each of the embodiments of the present disclosure. The switching element 160-1 is arranged on the distal side with respect to the switching element 160-2 on the emitter 110. The switching element 160-2 is arranged on the ground side with respect to the switching element 160-1 on the emitter 110. A relatively higher voltage is applied to the switching element 160-1 than the switching element 160-2. Thus, the control unit 150A sets the resistance value of the switching element 160-1 to be lower than the resistance value of the switching element 160-2 to improve the withstand voltage performance. On the other hand, the switching element 160-2 does not need to have withstand voltage performance as high as that of the switching element 160-1, the control unit 150A performs control to reduce the loss of the radio-frequency signal by setting the resistance value of the switching element 160-2 to be relatively high to make the electric field coupling sparse. The control unit 150A may acquire position information of the switching element 160-1 and the switching element 160-2 on the emitter 110 from the switching element 160-1 and the switching element 160-2, or may store provision positions in advance.

As illustrated in the third embodiment, in the case where the plurality of switching elements is connected on the emitter 110, it is possible to implement the communication apparatus capable of transmitting and receiving the radio-frequency signal in the high band by controlling the resistance values of all the switching elements according to the connected positions.

4-4. Control of Second Switching Process

Figure 18:
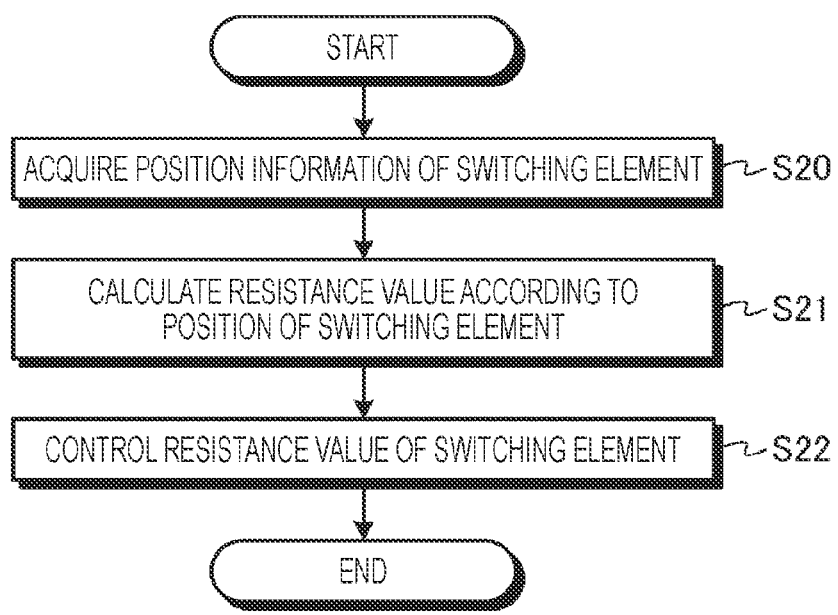
FIG. 18 is a flowchart illustrating a flow of control of the second switching process according to the third embodiment.

A flow of control of the second switching process according to the third embodiment will be described with reference to FIG. 18. FIG. 18 is a flowchart illustrating the flow of control of the second switching process according to the third embodiment.

The control unit 150A acquires position information of switching elements (step S20). Specifically, the control unit 150A acquires the position information of each of the switching element 160-1 and the switching element 160-2. The control unit 150A may acquire the position information of the switching element 160-1 and the switching element 160-2 stored in advance from a storage unit (not illustrated). Then, the process proceeds to step S21.

The control unit 150A calculates resistance values corresponding to the positions of the switching elements (step S21). Specifically, the control unit 150A calculates resistance values that need to be set in the switching element 160-1 and the switching element 160-2 on the basis of the position information acquired in step S20. Alternatively, the resistance values calculated in advance are stored in a memory as a look up table (LUT). Then, the process proceeds to step S22.

The control unit 150A controls resistance values of the switching elements (step S22). Specifically, the control unit 150A controls the resistance value of each of the switching element 160-1 and the switching element 160-2 according to the resistance values calculated in step S21. Then, the process of FIG. 18 ends.

The effects described in the present specification are merely examples and are not limited, and other effects may be present.

5. Effects

A switch circuit according to the present disclosure includes: a plurality of semiconductor elements 10 connected in series to each other; capacitive elements connected to at least some semiconductor elements 10 among the plurality of semiconductor elements 10; and the resistance element 30 connected between the capacitive elements. Therefore, it is possible to improve a withstand voltage and suppress a loss of the radio-frequency signal in the switch-off state.

Furthermore, the switch circuit according to the present disclosure includes the plurality of metal plates 20 arranged to cover the plurality of semiconductor elements 10 from above. The capacitive element includes a coupling capacitance apparently generated between the semiconductor element 10 and the metal plate 20. Therefore, an apparent coupling capacitance for improving the withstand voltage performance can be easily added.

Furthermore, the plurality of metal plates 20 is arranged so as to cover the plurality of semiconductor elements 10 in a one-to-one manner in the switch circuit according to the present disclosure. Therefore, the apparent coupling capacitance for improving the withstand voltage performance of a radio-frequency signal can be added according to a use situation.

Furthermore, the plurality of metal plates 20 is arranged so as to cover the plurality of semiconductor elements 10 in a one-to-many manner in the switch circuit according to the present disclosure. Therefore, the apparent coupling capacitance for improving the withstand voltage performance can be added according to the use situation.

Furthermore, the metal plates 20 are selectively arranged so as to cover the plurality of semiconductor elements 10 in a one-to-one manner in the switch circuit according to the present disclosure. Therefore, the coupling capacitance for improving the withstand voltage performance can be added according to the use situation.

Furthermore, the resistance element 30 is an insulator in the switch circuit according to the present disclosure. Therefore, it is possible to suppress an apparent increase in capacitance in a switch-off state according to the use situation, and thus, it is possible to suppress a loss of the radio-frequency signal in the switch-off state.

Furthermore, a resistance value of the resistance element 30 is weighted according to a magnitude of a signal voltage applied to each transistor in the switch-off state in the switch circuit according to the present disclosure. Therefore, it is possible to suppress an increase in apparent capacitance in the switch-off state according to the use situation, and thus, it is possible to suppress the loss of the radio-frequency signal in the switch-off state.

Furthermore, the resistance element 30 is a variable resistance element in the switch circuit according to the present disclosure. Therefore, a balance of voltages applied to the respective transistors can be adjusted.

Furthermore, the switch circuit according to the present disclosure includes the control unit 150 that controls a resistance value of the variable resistance element according to a magnitude of a voltage between electrodes of the semiconductor element 10. Therefore, the balance of the voltages applied to the respective transistors can be actively adjusted according to the use situation.

Furthermore, the insulator is a resin in the switch circuit according to the present disclosure. Therefore, a resin for packaging a semiconductor can be used as the insulator.

Furthermore, the resistance element is a bias resistor of the semiconductor element 10 in the switch circuit according to the present disclosure. Therefore, the bias resistor of the semiconductor element 10 can be shared as the resistance element for making the electric field coupling sparse, and thus, the switch circuit can be downsized.

Furthermore, the switch circuit according to the present disclosure includes: the switching element SW connected in parallel to the resistance element 30; and the control unit 150 that controls an opening/closing operation of the switching element SW according to the magnitude of the voltage between the electrodes of the semiconductor element. Therefore, a switch can be used as a configuration for making the electric field coupling sparse in the switch-off state. As a result, for example, even in the case where the resistance element 30 is made of resin, the balance of the voltages applied to the respective transistors can be actively adjusted according to the use situation.

A communication apparatus according to the present disclosure includes: the emitter 110 that transmits and receives a radio wave; a switch circuit connected to the emitter 110; and the control unit 150 that controls an operation of the switch circuit. The switch circuit includes: a plurality of semiconductor elements 10 connected in series to each other; capacitive elements connected to at least some semiconductor elements 10 among the plurality of semiconductor elements 10; and a variable resistance element connected between the capacitive elements. The control unit 150 controls a resistance value of the variable resistance element according to a magnitude of a voltage between electrodes of the semiconductor element 10. Therefore, it is possible to implement the communication apparatus in which an increase in apparent capacitance in a switch-off state is suppressed and a withstand voltage of a radio-frequency signal is improved.

Furthermore, the control unit 150 controls the resistance value of the variable resistance element according to a magnitude of input power used when the emitter 110 transmits the radio wave in the communication apparatus according to the present disclosure. Therefore, a balance of voltages applied to the transistors can be adjusted according to a communication situation.

Furthermore, the control unit 150 controls the resistance value of the variable resistance element according to a set communication scheme in the communication apparatus according to the present disclosure. Therefore, the balance of the voltages applied to the transistors can be adjusted according to the communication scheme set in the communication apparatus.

Furthermore, in a case where the communication scheme is time division duplex, the control unit 150 lowers the resistance value of the variable resistance element during transmission of the radio wave and raises the resistance value of the variable resistance element during reception of the radio wave in the communication apparatus according to the present disclosure. Therefore, the balance of the voltages applied to the transistors can be adjusted according to a communication state in the case where the communication scheme set in the communication apparatus is the time division duplex.

Furthermore, the control unit 150 controls the resistance value of the variable resistance element according to a magnitude of reflected power of the input power in the communication apparatus according to the present disclosure. Therefore, the balance of the voltages applied to the transistors can be adjusted according to the communication situation.

Furthermore, the communication apparatus according to the present disclosure includes an illuminance sensor arranged close to an antenna. The control unit 150 controls the resistance value of the variable resistance element according to a value of the illuminance sensor. Therefore, the balance of the voltages applied to the transistors can be adjusted according to a use situation of the communication apparatus.

Furthermore, the communication apparatus according to the present disclosure includes the conductor shield 70 that is arranged adjacent to the switch circuit and has a ground shared with the switch circuit. The conductor shield 70 is grounded to the ground via a resistance element. Therefore, it is possible to reduce a parasitic capacitance generated between the switch circuit and the conductor shield arranged adjacent to the switch circuit.

A communication apparatus according to the present disclosure includes: the emitter 110 that transmits and receives a radio wave; a switch circuit connected to the emitter 110; and the control unit 150 that controls an operation of the switch circuit. The switch circuit includes: a plurality of semiconductor elements connected in series to each other; capacitive elements connected to at least some of the plurality of semiconductor elements; a resistance element connected between the capacitive elements; and a switching element connected in parallel to the resistance element. The control unit 150 controls an opening/closing operation of the switching element according to a magnitude of a voltage between electrodes of the semiconductor element 10. Therefore, it is possible to implement the communication apparatus in which an increase in apparent capacitance in a switch-off state is suppressed and a withstand voltage of a radio-frequency signal is improved.

Note that the present technology can also have the following configurations.

(1)
A switch circuit including:
a plurality of semiconductor elements connected to each other in series;
capacitive elements connected to at least some of the plurality of semiconductor elements; and
a resistance element connected between the capacitive elements.

(2)
The switch circuit according to the above (1), further including
a plurality of metal plates arranged to cover the plurality of semiconductor elements from above,
the capacitive element including a coupling capacitance generated between the semiconductor element and the metal plate.

(3)
The switch circuit according to the above (2), in which
the plurality of metal plates is arranged to cover the plurality of semiconductor elements in a one-to-one manner.

(4)
The switch circuit according to the above (2), in which
the plurality of metal plates is arranged to cover the plurality of semiconductor elements in a one-to-many manner.

(5)
The switch circuit according to the above (3), in which
the metal plates are selectively arranged to cover the plurality of semiconductor elements in a one-to-one manner.

(6)
The switch circuit according to any one of the above (1) to (5), in which
the resistance element is an insulator.

(7)
The switch circuit according to any one of the above (1) to (6), in which
a resistance value of the resistance element is weighted in accordance with a magnitude of a voltage applied to each of the semiconductor elements in a switch-off state.

(8)
The switch circuit according to any one of the above (1) to (7), in which
the resistance element is a variable resistance element.

(9)
The switch circuit according to the above (8), further including
a control unit configured to control a resistance value of the variable resistance element in accordance with a magnitude of a voltage between electrodes of the semiconductor element.

(10)
The switch circuit according to the above (6), in which
the insulator is a resin.

(11)
The switch circuit according to any one of the above (1) to (10), in which
the resistance element is a bias resistor of the semiconductor element.

(12)
The switch circuit according to any one of the above (1) to (11), further including:
a switching element connected in parallel to the resistance element; and
a control unit configured to control an opening/closing operation of the switching element in accordance with a magnitude of a voltage between electrodes of the semiconductor element.

(13)
A communication apparatus including:
an emitter configured to transmit and receive a radio wave;
a switch circuit connected to the emitter; and
a control unit configured to control an operation of the switch circuit,
the switch circuit including:
a plurality of semiconductor elements connected in series to each other;
capacitive elements connected to at least some of the plurality of semiconductor elements; and
a variable resistance element connected between the capacitive elements, and
the control unit
controlling a resistance value of the variable resistance element in accordance with a magnitude of a voltage between electrodes of the semiconductor element.

(14)

The communication apparatus according to the above (13), in which the control unit controls the resistance value of the variable resistance element in accordance with a magnitude of input power used when the emitter transmits the radio wave.

(15)

The communication apparatus according to the above (13) or (14), in which the control unit controls the resistance value of the variable resistance element in accordance with a set communication scheme.

(16)

The communication apparatus according to the above (15), in which the control unit lowers the resistance value of the variable resistance element during transmission of the radio wave and raises the resistance value of the variable resistance element during reception of the radio wave in a case where the communication scheme is time division duplex.

(17)

The communication apparatus according to the above (14), in which the control unit controls the resistance value of the variable resistance element in accordance with a magnitude of reflected power of the input power.

(18)

The communication apparatus according to any one of the above (13) to (17), further including an illuminance sensor arranged close to an antenna, the control unit controlling the resistance value of the variable resistance element in accordance with a value of the illuminance sensor.

(19)

The communication apparatus according to any one of the above (13) to (18), further including a conductor shield that is arranged adjacent to the switch circuit and share a ground with the switch circuit, the conductor shield being grounded to the ground via a resistance element.

(20)

A communication apparatus including:

an emitter configured to transmit and receive a radio wave;

a switch circuit connected to the emitter; and a control unit configured to control an operation of the switch circuit, the switch circuit including:

a plurality of semiconductor elements connected in series to each other;

capacitive elements connected to at least some of the plurality of semiconductor elements;

a resistance element connected between the capacitive elements; and a switching element connected in parallel to the resistance element, and the control unit controlling an opening/closing operation of the switching element in accordance with a magnitude of a voltage between electrodes of the semiconductor element.

REFERENCE SIGNS LIST

1 Radio-frequency switch
10 Semiconductor element
20 Metal plate
30 Resistance element
40 Input electrode
50 Output electrode

The invention claimed is:

1. A switch circuit, comprising:
a plurality of semiconductor elements connected in series;
a plurality of capacitive elements connected to at least a set of semiconductor elements of the plurality of semiconductor elements;
a resistance element connected between the plurality of capacitive elements;
a switching element connected in parallel to the resistance element;
a control unit configured to control an opening operation or a closing operation of the switching element based on a first magnitude of a first voltage between electrodes of each of the plurality of semiconductor elements; and
a plurality of metal plates to cover the plurality of semiconductor elements, wherein each of the plurality of capacitive elements includes a coupling capacitance between a specific semiconductor element of the plurality of semiconductor elements and a respective metal plate of the plurality of metal plates.

2. The switch circuit according to claim 1, wherein each of the plurality of metal plates covers a respective semiconductor element of the plurality of semiconductor elements.

3. The switch circuit according to claim 2, wherein each of the plurality of metal plates selectively covers the respective semiconductor element of the plurality of semiconductor elements in a one-to-one manner.

4. The switch circuit according to claim 1, wherein the plurality of metal plates covers the plurality of semiconductor elements in a one-to-many manner.

5. The switch circuit according to claim 1, wherein the resistance element is an insulator.

6. The switch circuit according to claim 5, wherein the insulator is a resin.

7. The switch circuit according to claim 1, wherein a resistance value of the resistance element is based on a second magnitude of a second voltage applied to each of the plurality of semiconductor elements in a switch-off state.

8. The switch circuit according to claim 7, wherein the resistance element is a variable resistance element.

9. The switch circuit according to claim 8, wherein the control unit is further configured to control the resistance value based on the first magnitude of the first voltage.

10. The switch circuit according to claim 1, wherein the resistance element is a bias resistor.

11. A communication apparatus, comprising:
an emitter configured to transmit and receive a radio wave;
a switch circuit connected to the emitter;
a control unit configured to control an operation of the switch circuit, wherein the switch circuit includes:
a plurality of semiconductor elements connected in series;
a plurality of capacitive elements connected to at least a set of semiconductor elements of the plurality of semiconductor elements; and
a variable resistance element connected between the plurality of capacitive elements, wherein the control unit is further configured to control a resistance value of the variable resistance element based on a magnitude of a voltage between electrodes of each of the plurality of semiconductor elements; and a conductor shield adjacent to the switch circuit, wherein
the conductor shield shares a ground with the switch circuit, and
the conductor shield is grounded to the ground via the variable resistance element.

12. The communication apparatus according to claim 11, wherein the control unit is further configured to control the resistance value of the variable resistance element based on a magnitude of input power for the transmission of the radio wave by the emitter.

13. The communication apparatus according to claim 12, wherein the control unit is further configured to control the resistance value of the variable resistance element based on a magnitude of a reflected power of the input power.

14. The communication apparatus according to claim 11, wherein the control unit is further configured to control the resistance value of the variable resistance element based on a communication scheme.

15. The communication apparatus according to claim 14, wherein based on the communication scheme is time division duplex, the control unit is further configured to lower the resistance value of the variable resistance element during the transmission of the radio wave and raise the resistance value of the variable resistance element during the reception of the radio wave.

16. The communication apparatus according to claim 11, further comprising an illuminance sensor in a vicinity of an antenna, wherein
the control unit is further configured to control the resistance value of the variable resistance element based on a value of the illuminance sensor.

17. A communication apparatus, comprising:
an emitter configured to transmit and receive a radio wave;
a switch circuit connected to the emitter;
a control unit configured to control an operation of the switch circuit, wherein the switch circuit includes:
a plurality of semiconductor elements connected in series;
a plurality of capacitive elements connected to at least a set of semiconductor elements of the plurality of semiconductor elements;
a resistance element connected between the plurality of capacitive elements; and
a switching element connected in parallel to the resistance element, wherein the control unit is further configured to control an opening operation or a closing operation of the switching element based on a magnitude of a voltage between electrodes of each of the plurality of semiconductor elements; and
a conductor shield adjacent to the switch circuit, wherein
the conductor shield shares a ground with the switch circuit, and
the conductor shield is grounded to the ground via a variable resistance element.

* * * * *